US009059315B2

(12) United States Patent
Ando et al.

(10) Patent No.: US 9,059,315 B2
(45) Date of Patent: Jun. 16, 2015

(54) CONCURRENTLY FORMING NFET AND PFET GATE DIELECTRIC LAYERS

(71) Applicants: International Business Machines Corporation, Armonk, NY (US); GLOBALFOUNDRIES Inc., Grand Cayman, KY (US)

(72) Inventors: Takashi Ando, Tuckahoe, NY (US); Maryjane Brodsky, Salt Point, NY (US); Michael P. Chudzik, Danbury, CT (US); Min Dai, Mahwah, NJ (US); Siddarth A. Krishnan, Peekskill, NY (US); Joseph F. Shepard, Jr., Poughkeepsie, NY (US); Yanfeng Wang, Fishkill, NY (US); Jinping Liu, Hopewell Junction, NY (US)

(73) Assignees: International Business Machines Corporation, Armonk, NY (US); GLOBALFOUNDRIES, Inc., Grand Cayman (KY)

(*) Notice: Subject to any disclaimer, the term of this patent is extended or adjusted under 35 U.S.C. 154(b) by 263 days.

(21) Appl. No.: 13/732,455

(22) Filed: Jan. 2, 2013

(65) Prior Publication Data

US 2014/0187028 A1    Jul. 3, 2014

(51) Int. Cl.
    *H01L 21/3205*  (2006.01)
    *H01L 21/4763*  (2006.01)
    *H01L 21/8238*  (2006.01)

(52) U.S. Cl.
    CPC ............................ *H01L 21/823857* (2013.01)

(58) Field of Classification Search
    None
    See application file for complete search history.

(56) References Cited

U.S. PATENT DOCUMENTS

| 6,506,676 | B2 | 1/2003 | Park et al. |
| 6,780,720 | B2 | 8/2004 | Burnham et al. |
| 6,821,833 | B1 | 11/2004 | Chou et al. |
| 7,381,619 | B2 | 6/2008 | Wang et al. |
| 7,759,260 | B2 | 7/2010 | Burnham et al. |
| 8,193,051 | B2 | 6/2012 | Bojarczuk, Jr. et al. |
| 2007/0122977 | A1* | 5/2007 | Kim et al. ............... 438/261 |
| 2009/0008720 | A1* | 1/2009 | Doris et al. ............. 257/369 |
| 2010/0244206 | A1 | 9/2010 | Bu et al. |
| 2011/0115026 | A1* | 5/2011 | Jagannathan et al. ..... 257/369 |
| 2011/0306171 | A1 | 12/2011 | Lim et al. |
| 2012/0146160 | A1* | 6/2012 | Tan et al. ............... 257/412 |

OTHER PUBLICATIONS

V. S. Chang et al., "Effects of Al2O3 Dielectric Cap and Nitridation on Device Performance, Scalability, and Reliability for Advanced High-κ/Metal Gate pMOSFET Applications," IEEE Transactions on Electron Devices, vol. 54, Issue 10, Oct. 2007, pp. 2738-2749.
S. Kubicek et al., "Low VT CMOS using doped Hf-based oxides, TaC-based Metals and Laser-only Anneal," IEEE International Electron Devices Meeting, IEDM 2007, Dec. 10-12, 2007, pp. 49-52.
M. Kadoshima et al., "Effective-Work-Function Control by Varying the TiN Thickness in Poly-Si/TiN Gate Electrodes for Scaled High-k CMOSFETs," IEEE Electron Device Letters, vol. 30, No. 5, May 2009, p. 466-468.
* cited by examiner

*Primary Examiner* — Calvin Choi
(74) *Attorney, Agent, or Firm* — Yuanmin Cai; L. Jeffrey Kelly

(57) ABSTRACT

Embodiments include methods of forming an nFET-tuned gate dielectric and a pFET-tuned gate dielectric. Methods may include forming a high-k layer above a substrate having a pFET region and an nFET region, forming a first sacrificial layer, a pFET work-function metal layer, and a second sacrificial layer above the first high-k layer in the pFET region, and an nFET work-function metal layer above the first high-k layer in the nFET region and above the second sacrificial layer in the pFET region. The first high-k layer then may be annealed to form an nFET gate dielectric layer in the nFET region and a pFET gate dielectric layer in the pFET region. The first high-k layer may be annealed in the presence of a nitrogen source to cause atoms from the nitrogen source to diffuse into the first high-k layer in the nFET region.

20 Claims, 5 Drawing Sheets

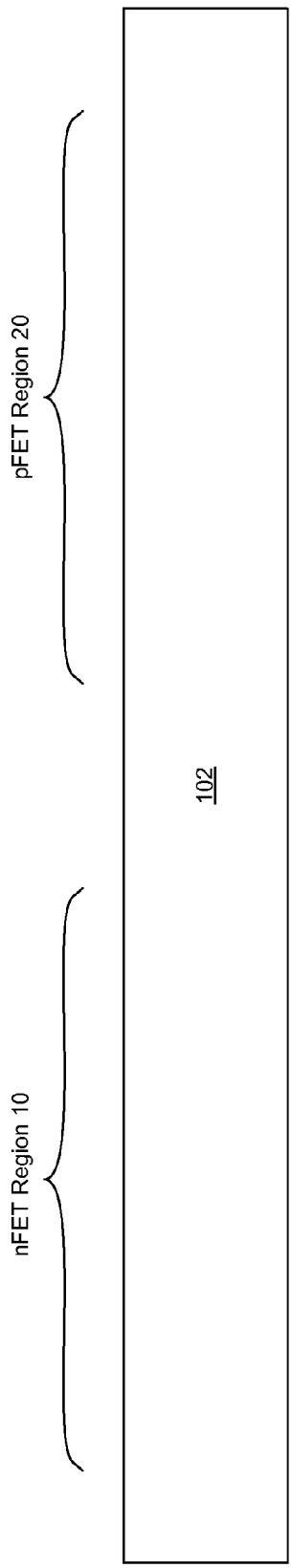
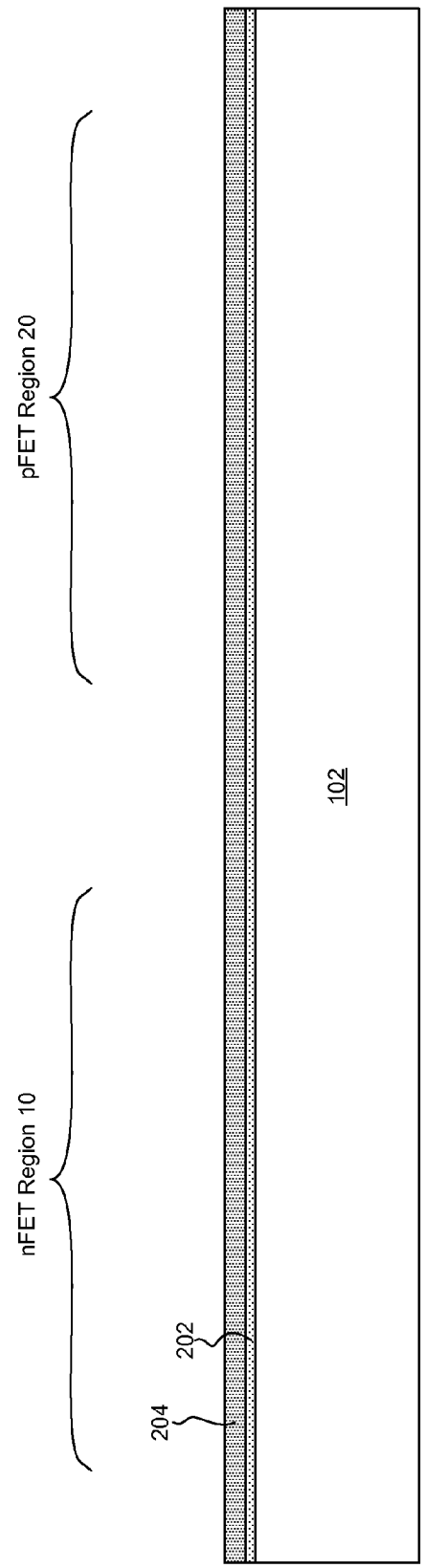

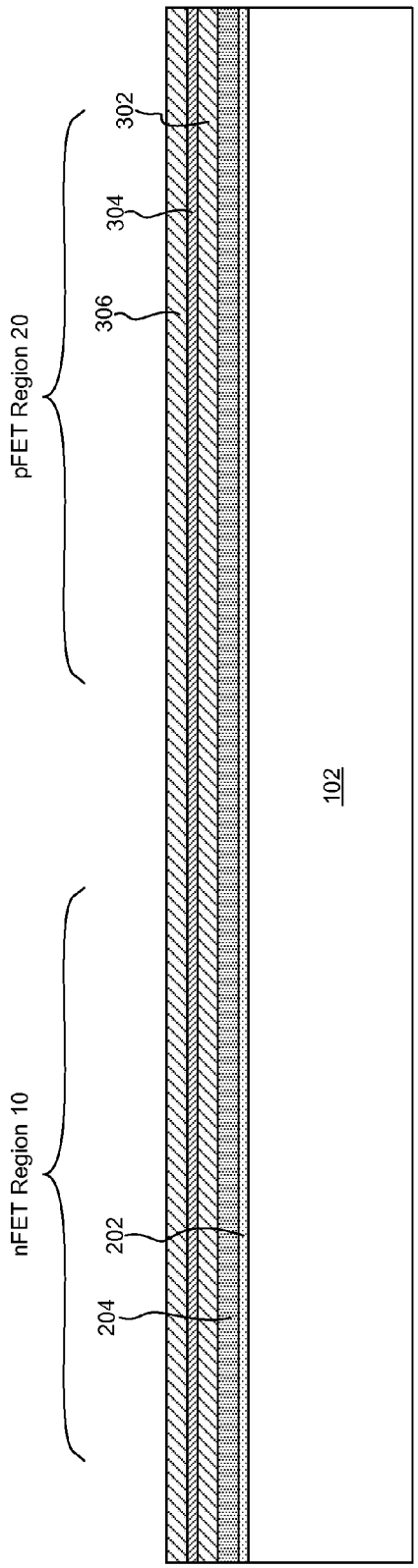
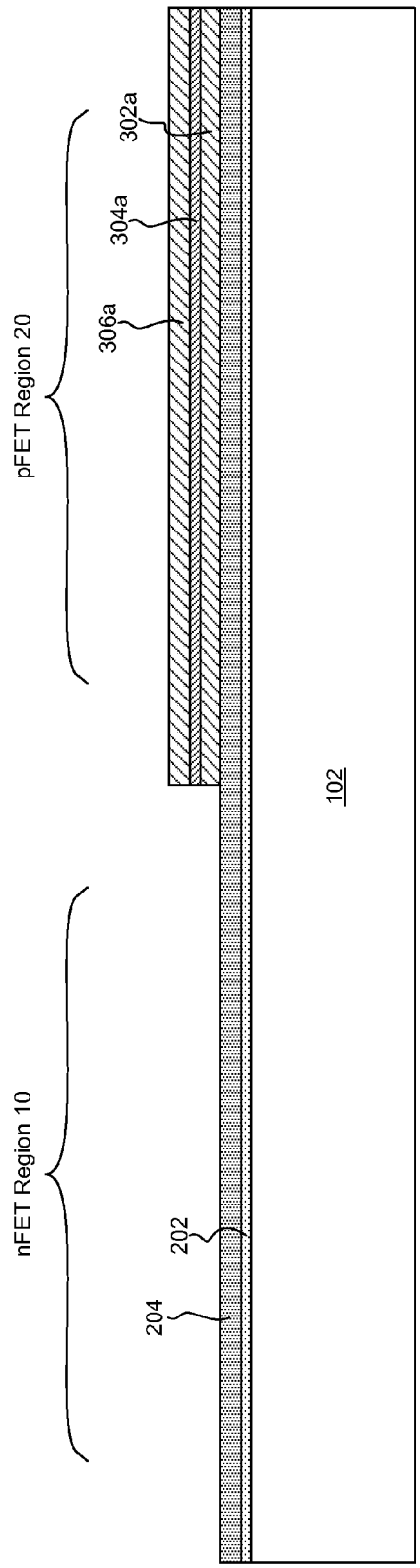

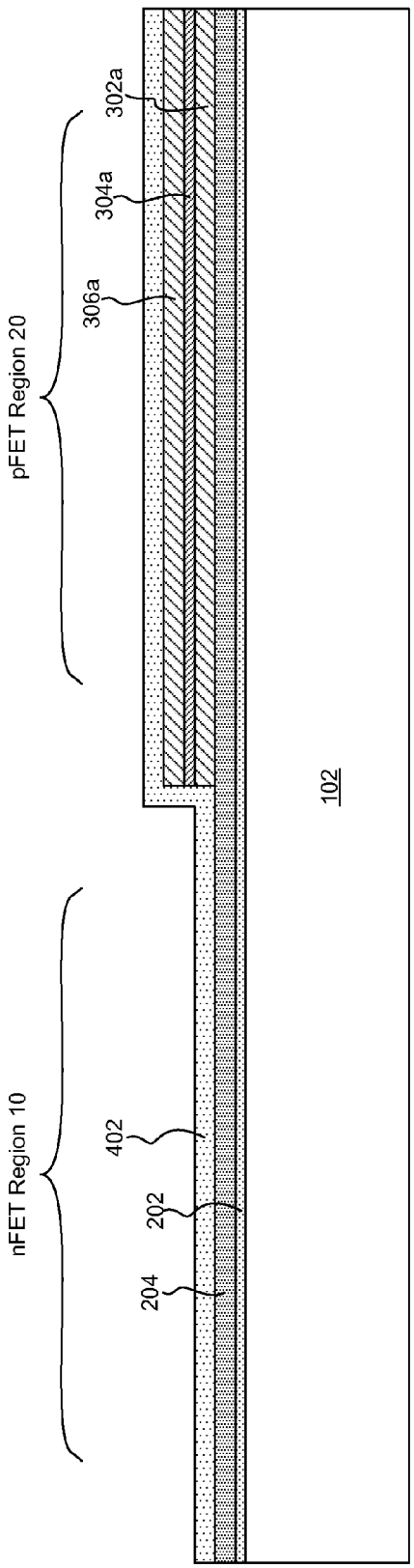
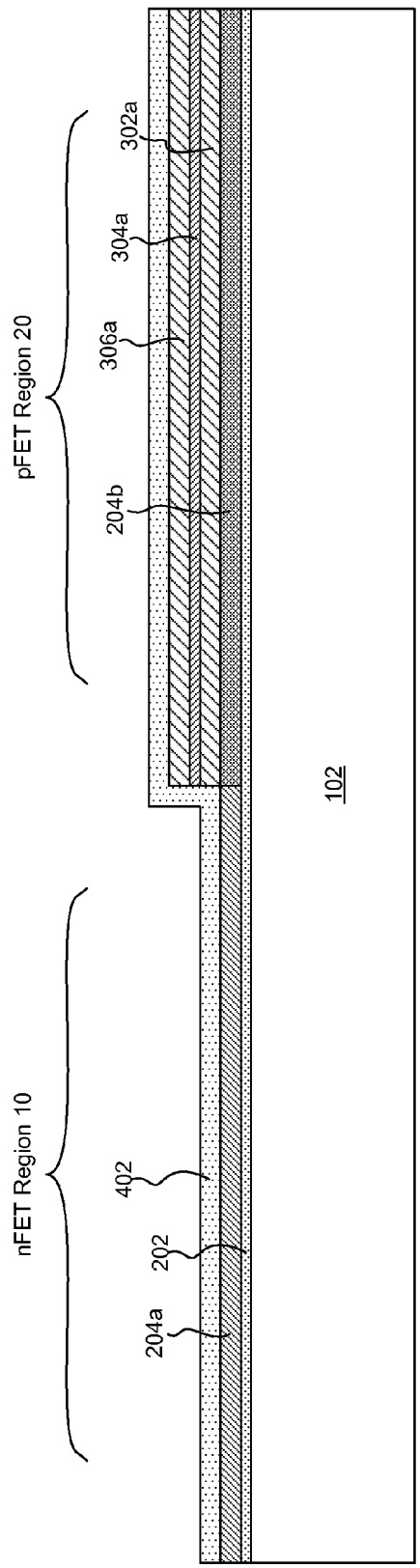

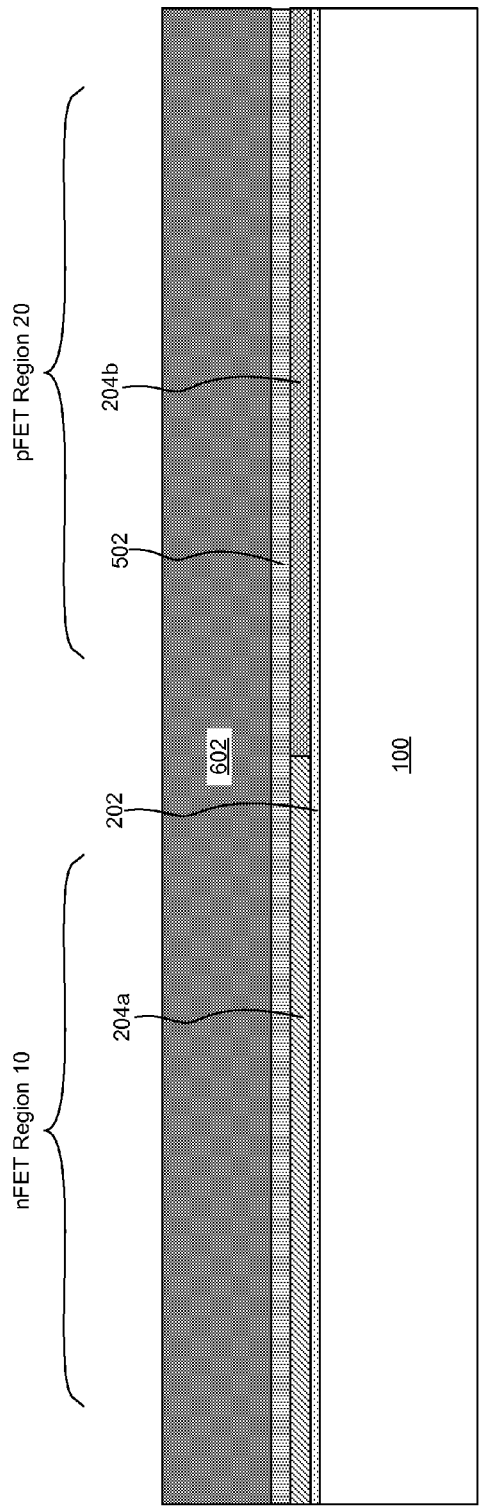
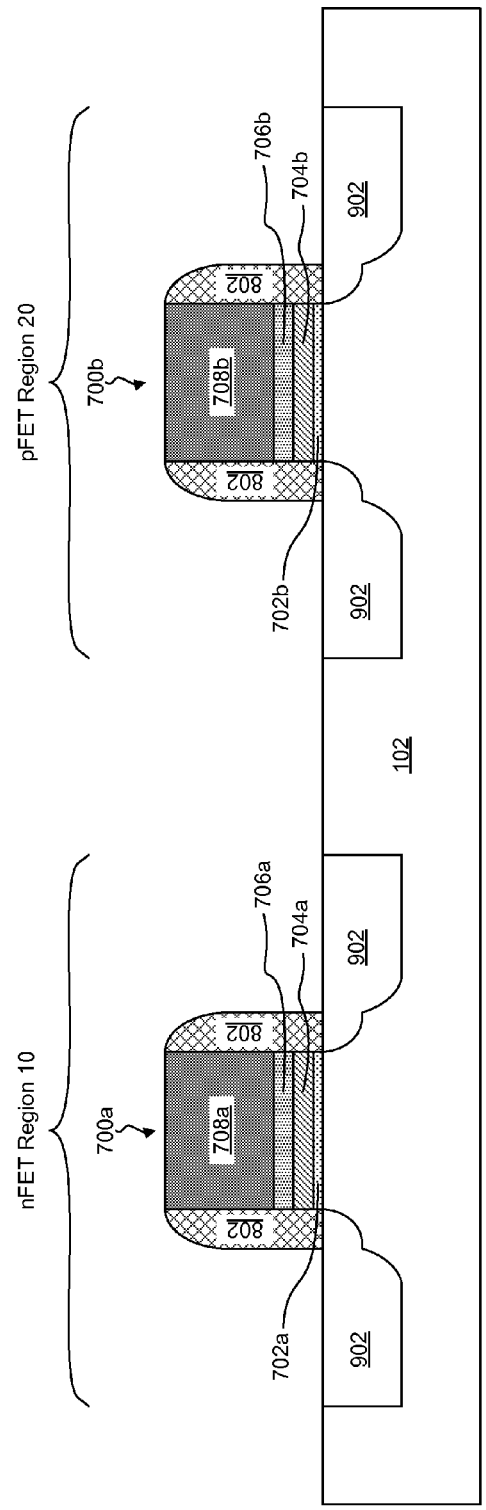
FIG. 9
FIG. 10

US 9,059,315 B2

CONCURRENTLY FORMING NFET AND PFET GATE DIELECTRIC LAYERS

BACKGROUND

The present invention generally relates to semiconductor devices, and particularly to forming gate dielectric layers of n-type field effect transistors (nFETs) and p-type field effect transistors (pFETs).

Metal-oxide-semiconductor (MOS) technology is a commonly used technology for fabricating field effect transistors (FETs) as part of advanced integrated circuits, such as CPUs, memory, and storage devices, and the like. In MOS technology, a FET may be formed by depositing a gate structure over a channel region connecting a source and a drain. For planar FETs, the channel region is formed in a semiconductor substrate on which the gate structure is formed. In finFETs, the gate structure may be formed over or around a semiconductor fin on an insulator layer, with a source and a drain formed on opposite ends of the semiconductor fin.

In MOS technology, the gate structure may be made of a gate dielectric and a gate electrode. In traditional MOS-FETs, the gate dielectric consists of a silicon dioxide layer intended in part to prevent current from leaking from the gate electrode into the channel. However, as the critical dimensions of modern microelectronic structures continues to decrease, silicon dioxide gate dielectrics may not be reliably used as gate dielectrics. Therefore, an increasing trend in microelectronic devices is to at least partially replace the silicon dioxide gate dielectric with a high-k dielectric, such as tantalum oxide, strontium titanium oxide, hafnium oxide, hafnium silicon oxide, aluminum oxide or zirconium oxide. These high-k dielectrics may be reliably fabricated with thicknesses much greater than an equivalent silicon dioxide layer while maintaining approximately the same ability to prevent leakage. Additionally, there has been a trend to replace the traditional doped polysilicon gate electrode with a metal gate electrode to reduce the effects of the poly gate depletion phenomenon.

However, the change to a high-k gate dielectric and/or a metal gate may result in sub-optimal threshold voltages, particularly in pFET devices. One method of readjusting the threshold voltages of FET devices is through the use of work-function metals, which may be diffused into the gate dielectric to adjust the threshold voltage of the FET. However, the ideal work-function metals for tuning the threshold voltage of a pFET device and nFET device may differ. Additionally, nitridation of the gate dialectic has proven to be an effective method of nFET devices. However, nitridation of a pFET gate dielectric may tune the threshold voltage of the pFET device away from optimal levels.

Therefore, a method of concurrently tuning gate dielectrics of nFET and pFET devices using different work-function metals while also selectively nitriding the gate dielectric of the nFET device is desirable.

BRIEF SUMMARY

The present invention relates to forming nFET-tuned and pFET-tuned portions of a high-k dielectric layer. According to at least one exemplary embodiment, a first high-k dielectric layer may be formed above a semiconductor substrate having a pFET region and an nFET region. A first sacrificial layer may then be formed above the first high-k dielectric layer in the pFET region, followed by a pFET work-function metal layer above the first sacrificial layer, a second sacrificial layer above the pFET work-function metal layer, and an nFET work-function metal layer above the first high-k dielectric layer in the nFET region of the semiconductor substrate and above the second sacrificial layer in the pFET region of the semiconductor substrate. The first high-k dielectric then be annealed to form an nFET gate dielectric layer in the nFET region and a pFET gate dielectric layer in the pFET region. The annealing process may be performed in the presence of a nitrogen source to cause nitrogen to diffuse into the first high-k dielectric layer in the nFET region.

Another embodiment of the invention relates to forming an nFET gate and a pFET gate on a semiconductor substrate. According to at least one exemplary embodiment, a first high-k dielectric layer above a semiconductor substrate having a pFET region and an nFET region. A pFET stack including a first sacrificial layer, a pFET work-function metal layer above the first sacrificial layer, and a second sacrificial layer above the pFET work-function metal layer may then be formed above the pFET region. An nFET work-function metal may then be deposited above the first high-k dielectric layer in the nFET region of the semiconductor substrate and above the pFET stack in the pFET region of the semiconductor substrate. The first high-k dielectric layer may then be annealed in the presence of a nitrogen source to diffuse atoms from the nFET work-function metal and the nitrogen source into the first high-k dielectric layer in the nFET region and diffuse atoms from the pFET work-function metal into the first high-k dielectric layer in the pFET region. The nFET work-function metal may and the pFET stack may then be removed prior to forming a gate electrode layer above the first high-k dielectric layer. An nFET gate and a pFET gate may then be formed by etching the gate electrode layer and the first high-k dielectric layer in the nFET region and the pFET region, respectively.

BRIEF DESCRIPTION OF THE SEVERAL VIEWS OF THE DRAWINGS

FIG. 1 depicts a semiconductor substrate including a pFET region and an nFET region, according to one embodiment of the present invention.

FIG. 2 depicts forming an interfacial oxide layer and a first gate dielectric layer above the semiconductor substrate, according to one embodiment of the present invention.

FIG. 3 depicts forming a first titanium nitride layer above the first gate dielectric layer above the first titanium nitride layer, an nFET work-function metal layer above the first titanium nitride layer, and a second titanium nitride layer above the nFET work-function metal layer, according to one embodiment of the present invention.

FIG. 4 depicts removing the first titanium nitride layer, the nFET work-function metal layer, and the second titanium nitride layer from the pFET region, according to one embodiment of the present invention.

FIG. 5 depicts forming a pFET work-function metal layer above the gate dielectric layer in the pFET region and the second titanium nitride layer in the nFET region, according to one embodiment of the present invention.

FIG. 6 depicts forming a pFET portion and an nFET portion in the first gate dielectric layer, according to one embodiment of the present invention.

FIG. 9 depicts forming a gate electrode layer above the second gate dielectric layer, according to one embodiment of the present invention.

FIG. 10 depicts forming a pFET gate from the interfacial layer, the pFET portion of the first gate dielectric layer, the second gate dielectric layer, and the gate electrode layer and forming Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Figure 7:
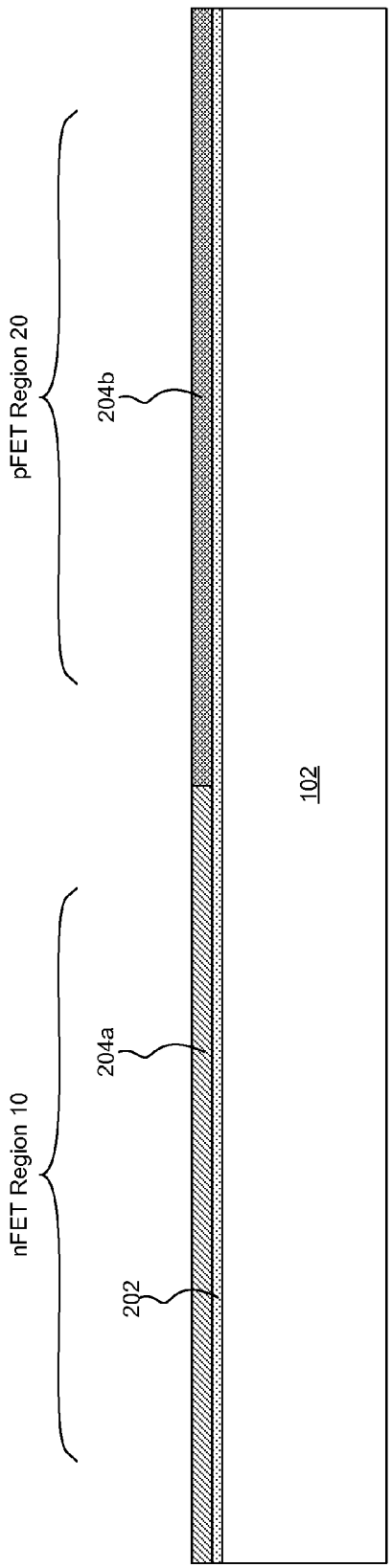
FIG. 7 depicts removing the pFET work-function metal layer, the first titanium nitride layer, the nFET work-function metal layer, and the second titanium nitride layer from above the first gate dielectric layer, according to one embodiment of the present invention.

Detailed embodiments of the claimed invention are disclosed herein; however, it can be understood that the disclosed embodiments are merely illustrative of the claimed structures and methods that may be embodied in various forms. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

It should be noted that the embodiments of the invention disclosed below may be fabricated using either a gate-first or gate-last (also known as a replacement gate) process flow. A gate-first process flow will be relied on for the description below.

In a gate-last fabrication approach, a dummy gate may be formed over a semiconductor channel. Spacers may then be formed on opposite sidewalls of the dummy gate and source/drain regions may be formed adjacent to the semiconductor channel. The dummy gate and the spacers may then be surrounded by an inter-level dielectric. Later, after subsequent fabrication processes, the dummy gate may be removed from between the spacers by, for example, an anisotropic vertical etch process such as reactive ion etching (RIE) or plasma etching. This creates an opening between the pair of device spacers where a metal gate may then be formed between the pair of device spacers.

In a gate-first fabrication approach, a gate may be formed by patterning and then etching a stack of layers deposited over a semiconductor channel. Spacers may then be formed on sidewalls of the gate and source/drain regions may be formed adjacent to the semiconductor channel. The gate is not removed after subsequent processing steps.

Further, embodiments of the invention may also include both planar field effect transistor (FET) devices and finFET devices. In planar FET devices, the semiconductor channel may be formed in a semiconductor substrate above which a gate may be formed. A finFET device may include one or more fins formed in on a semiconductor wafer or an insulator layer, a gate covering a portion of the fins, where the portion of the fins covered by the gate serves as a channel region of the device and portions of the fins extending out from under the gate may serve as source and drain regions of the device. While the embodiments depicted in FIGS. 1-10 are directed at planar FET devices, finFET devices are also explicitly contemplated.

Referring to FIG. 1, a substrate 102 is depicted on which an n-type field effect transistor (nFET) device may be formed in nFET region 10 and a p-type field effect transistor (pFET) device may be formed in pFET region 20. The substrate 102 may be made of any semiconductor material including, but not limited to: silicon, germanium, silicon-germanium, carbon-doped silicon, carbon-doped silicon-germanium, and compound (e.g. III-V and II-VI) semiconductor materials. Non-limiting examples of compound semiconductor materials include gallium arsenide, indium arsenide, and indium phosphide. In some embodiments, the substrate 102 may have a thickness of up to approximately 1.5 mm. The substrate 102 may be a semiconductor on insulator (SOI) substrate and include a buried insulator layer (not shown) and a base substrate (not shown). The substrate 102 may also include isolation regions outside the nFET region 10 and the pFET region 20, for example shallow trench isolation (STI) structures. The substrate 102 may also include doped regions (not shown) including, for example, an phosphoric-doped or arsenic doped well in the nFET region 10 and a boron-doped well in the pFET region 20.

Referring to FIG. 2, an interfacial layer 202 and a first high-k dielectric layer 204 may be formed above the substrate 102. The interfacial layer 202 may be formed by thermally oxidizing a top portion of the substrate 102. In other embodiments, the interfacial layer 202 may be formed by depositing an insulating layer, for example silicon oxide or silicon oxynitride (preferably with a low nitrogen ratio), above the substrate 102 using known deposition techniques including, for example, chemical vapor deposition (CVD) or atomic layer deposition (ALD). The interfacial layer 202 may have a vertical thickness of approximately 0 nm to approximately 5 nm.

The first high-k dielectric layer 204 may be formed by any suitable deposition technique known in the art, such as, for example, chemical vapor deposition (CVD), plasma-assisted CVD, atomic layer deposition (ALD), evaporation, reactive sputtering, chemical solution deposition or other like deposition processes. The first high-k dielectric layer 204 may also be formed using any combination of the above processes. The first high-k dielectric layer 204 may be made of an insulating material including, but not limited to: oxides, nitrides, oxynitrides or silicate including metal silicates and nitrided metal silicates. Typically, the high-k dielectric constant will have a dielectric constant of at least approximately 8.0. In one embodiment, the first high-k dielectric layer 204 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the first high-k dielectric layer 204 may vary, but typically may have a thickness ranging from approximately 0.5 nm to approximately 5 nm. In one embodiment, the high-k dielectric layer may be made of a $HfO_2$ layer having a thickness of approximately 2 nm.

Referring to FIG. 3, a first sacrificial layer 302, a pFET work-function metal layer 304 and a second sacrificial layer 306 may be formed above the first high-k dielectric layer 204. Collectively, the first sacrificial layer 302, the pFET work-function metal layer 304 and the second sacrificial layer 306 may be referred to as a pFET stack. The first sacrificial layer 302 may be formed on the first high-k dielectric layer 204 using known deposition techniques including physical vapor deposition (PVD), chemical vapor deposition (CVD), and atomic layer deposition (ALD). The first sacrificial layer 302 should be thin enough to allow atoms from the pFET work-function metal layer 304 to diffuse into the first high-k dielectric layer 204. In some embodiments, the first sacrificial layer 302 may have a thickness of approximately 0.2 nm to approximately 2.5 nm and be made of an insulating material such as, for example, titanium nitride or tantalum nitride. In one embodiment, the first sacrificial layer 302 may be made of titanium nitride and have a thickness of approximately 1 nm.

The pFET work-function metal layer 304 may be formed on the first sacrificial layer 302 using known deposition techniques including PVD, CVD, and ALD. The pFET work-function metal layer 304 may have a thickness of approximately 0.1 nm to approximately 3 nm and be made of metal such as, for example, aluminum or molybdenum. Other embodiments may include pFET work-function metals with atoms capable of diffusing through the first sacrificial layer 302. In one embodiment, the pFET work-function metal layer 304 may be made of aluminum and have a thickness of approximately 1 nm.

The second sacrificial layer 306 may be formed on the pFET work-function metal layer 304 using known deposition techniques including PVD, CVD, and ALD. The second sacrificial layer 306 should be thick enough to prevent atoms from layer formed above the second sacrificial layer 306 from diffusing into the first high-k dielectric layer 204. The second sacrificial layer 306 may have a thickness of approximately 0.2 nm to approximately 5 nm and be made of an insulating material such as, for example, titanium nitride or tantalum nitride. In one embodiment, the second sacrificial layer 306 may be made of titanium nitride and have a thickness of approximately 3 nm.

Referring to FIG. 4, the first sacrificial layer 302, the pFET work-function metal 304 and the second sacrificial layer 306 may be selectively removed from the nFET region 10 to form a first sacrificial layer portion 302a, a pFET work-function metal layer portion 304a and a second sacrificial layer portion 306a in the pFET region 20. Portions of the first sacrificial layer 302, the pFET work-function metal 304 and the second sacrificial layer 306 may be selectively removed using known etching techniques, including depositing a photoresist layer (not shown) above the second sacrificial layer, developing the photoresist layer to expose the second sacrificial layer 306 in the nFET region 10, and etching the first sacrificial layer 302, the pFET work-function metal 304 and the second sacrificial layer 306 using known anisotropic etching processes such as reactive ion etching (RIE) and plasma etching.

Referring to FIG. 5, an nFET work-function metal layer 402 may be deposited above the first high-k dielectric layer 204 in the nFET region 10 and above second sacrificial layer portion 306a in the pFET region 20 using known deposition techniques including PVD, CVD, and ALD. The nFET work-function metal layer 402 may have a thickness of approximately 0.1 nm to approximately 2 nm and may be made of metal such as, for example, lanthanum oxide, magnesium oxide, strontium titanate, strontium oxide. In one embodiment, the nFET work-function metal layer 402 may be made of aluminum and have a thickness of approximately 0.2 nm.

Referring to FIG. 6, nFET-tuned dielectric portion 204a is formed in nFET region 10 and pFET-tuned dielectric portion 204b is formed in pFET region 20. nFET-tuned dielectric portion 204a and p-FET-tuned dielectric portion 204b may be formed by annealing the structure of FIG. 5 in the presence of a nitrogen source. The nitrogen source may be ammonia or nitrous oxide. The annealing process may occur at temperatures ranging from approximately 500 degrees Celsius to approximately 750 degrees Celsius and pressures ranging from approximately 0.1 torr to approximately 780 torr. The annealing process may occur for approximately 5 seconds to approximately 300 seconds. Compared to higher temperature work-function metal annealing processes which may occur at approximately 1000 degrees Celsius, the relatively low annealing temperature used here may allow for the process described in FIGS. 1-10 to be used in a wider array of process flows. The annealing process will result in atoms from the nFET work-function metal layer 402 migrating into the first high-k dielectric layer 204 (FIG. 5) in nFET region 10 and atoms from pFET work-function metal layer portion 304a migrating into the first high-k dielectric layer 204 in pFET region 20. At the same time, nitrogen atoms from the nitrogen source will migrate through the nFET work-function metal 402 and into the first high-k dielectric layer 204 in nFET region 10. Nitrogen may be prevented from migrating into the first high-k dielectric layer 204 in pFET region 20 by the greater total thickness of the first sacrificial layer portion 302a, the pFET work-function metal layer portion 304a and the second sacrificial layer portion 306a.

Referring to FIG. 7, the nFET work-function metal layer 402 (FIG. 6), the second sacrificial layer portion 306a (FIG. 6), the pFET work-function metal layer portion 304a (FIG. 6) and the first sacrificial layer portion 302a (FIG. 6) may be removed from above the nFET-tuned dielectric portion 204a and the pFET-tuned dielectric portion 204b. The nFET work-function metal layer 402, the second sacrificial layer portion 306a, the pFET work-function metal layer portion 304a, and the first sacrificial layer portion 302a may be removed using known isotropic or anisotropic etching process capable of selectively removing the layers without substantially damaging the nFET-tuned dielectric portion 204a and pFET-tuned dielectric portion 204b. In one embodiment, the nFET work-function metal layer 402, the second sacrificial layer portion 306a, the pFET work-function metal layer portion 304a, and the first sacrificial layer portion 302a may be removed using a series of selective wet-etching processes.

Figure 8:
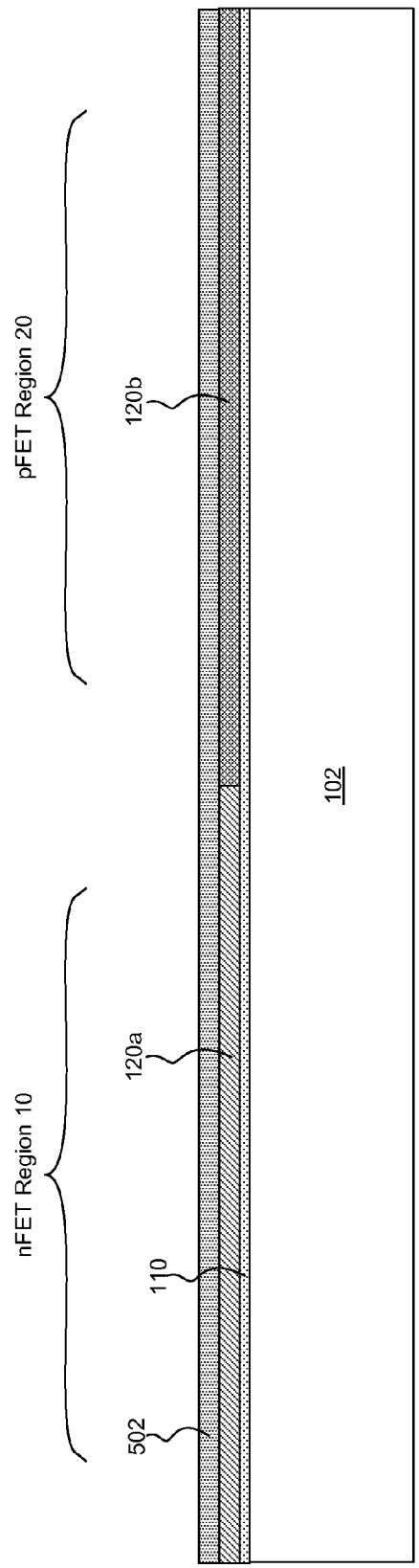
FIG. 8 depicts forming a second gate dielectric layer above the first gate dielectric layer, according to one embodiment of the present invention.

Referring to FIG. 8, a second high-k dielectric layer 502 may be deposited above the nFET-tuned dielectric portion 204a and the pFET-tuned dielectric portion 204b using known deposition techniques including PVD, CVD, and ALD. The second high-k dielectric layer 502 may be made of an insulating material including, but not limited to: oxides, nitrides, oxynitrides or silicate including metal silicates and nitrided metal silicates. Typically, the high-k dielectric material will have a dielectric constant of at least approximately 8.0. In one embodiment, the second high-k dielectric layer 502 may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. In some embodiments, the second high-k dielectric layer 502 may have the same material composition as the first dielectric layer 204. The second high-k dielectric layer 502 may have a thickness of approximately 0 nm to approximately 2 nm. In one embodiment, the second high-k dielectric layer 502 may be made of hafnium oxide and have a thickness of approximately 0.3 nm. By forming the second high-k dielectric layer 502, it may be possible to control the profile of the nitrogen and work-function metal atoms present in the combined high-k layer including the second high-k dielectric layer 502, the nFET dielectric portion 204a, and the pFET dielectric portion 204b.

Referring to FIG. 9, a gate electrode layer 602 may be formed above the second high-k dielectric layer 502. The gate electrode layer 602 may be made of gate conductor materials including, but not limited to, Zr, W, Ta, Hf, Ti, Al, Ru, Pa, metal oxides, metal carbides, metal nitrides, transition metal aluminides (e.g. Ti3Al, ZrAl), TaC, TiC, TaMgC, or any combination of those materials. The gate electrode layer 602 may further include one or more low resistance gate capping layers such as TiN, W, Ti, Al, Ta, TaN, Co, TiC, TaC, Ni, or a combination thereof. Processes for forming gate electrodes are well-known in the art and other methods of forming the gate electrode layer 602 are explicitly contemplated. The metal layer 602 may have a thickness of approximately 1 nm to approximately 50 nm.

Referring to FIG. 10, an nFET device 15 and a pFET device 25 may be formed on the substrate 102 in nFET region 10 and pFET region 20, respectively. An nFET gate stack 700a include an nFET interfacial layer portion 702a, a first nFET gate dielectric layer 704a, a second nFET gate dielectric layer 706a, and an nFET gate electrode 708a formed by etching the interfacial layer 202, the nFET-tuned dielectric portion 204a, the second high-k dielectric layer 502, and the gate electrode layer 602, respectively. An pFET gate stack 700b include a pFET interfacial layer portion 702b, a first pFET gate dielectric layer 704b, a second pFET gate dielectric layer 706b, and an pFET gate electrode 708b formed by etching the interfacial layer 202, the pFET-tuned dielectric portion 204b, the second high-k dielectric layer 502, and the gate electrode layer 602, respectively. The nFET gate stack 700a and the pFET gate stack 700b may be formed simultaneously.

Spacers 802 may be formed on sidewalls of the nFET gate stack 700a and sidewalls of the pFET gate stack 700b. The spacers 802 may be formed by depositing a conformal insulating layer, for example silicon nitride, over the nFET gate stack 700a and the pFET gate stack 700b and using a anisotropic etching process to remove unwanted material. Methods of forming spacers are well-known in the art and other methods are explicitly contemplated. Further, in various embodiments, the spacers 802 may include one or more layers.

Source/drain regions 902 may then be formed in the substrate adjacent to the nFET gate stack 700a and the pFET gate stack 700b. In one embodiment, source/drain regions 902 may be formed by doping the substrate 102 in regions adjacent to the nFET gate stack 700a and the pFET gate stack 700b. Dopants may include, for example, arsenic or phosphorus in the nFET region 10 and boron in the pFET region 20. Dopant concentration may range from approximately $1\times10^{19}$ $cm^{-3}$ to approximately $2\times10^{21}$ $cm^{-3}$, preferably approximately $1\times10^{20}$ $cm^{-3}$ to approximately $1\times10^{21}$ $cm^{-3}$. Extension implants of dopants may be included to extend the source/drain regions 902 beneath the spacers 802. Other known methods of forming source/drain regions, including, for example, raised source/drain processes, are explicitly contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor device comprising:
   forming a first high-k dielectric layer above a semiconductor substrate having a pFET region and an nFET region;
   forming a first sacrificial layer above a portion of the first high-k dielectric layer only in the pFET region, another portion of the first high-k dielectric layer remaining exposed in the nFET region;
   forming a pFET work-function metal layer above and in direct contact with only the first sacrificial layer;
   forming a second sacrificial layer above and in direct contact with only the pFET work-function metal layer;
   forming an nFET work-function metal layer above and in direct contact with the portion of the first high-k dielectric layer only in the nFET region, above and in direct contact with the second sacrificial layer in the pFET region, and along a sidewall of each of the first sacrificial layer, the pFET work function metal layer, and the second sacrificial layer;
   forming a pFET gate dielectric layer in the pFET region from the portion of the first high-k dielectric layer in the pFET region by annealing the pFET work function metal layer and the portion of the first high-k dielectric layer in the pFET region; and
   forming an nFET gate dielectric layer in the nFET region from the portion of the first high-k dielectric layer in the nFET region by annealing the nFET work function metal layer and the portion of the first high-k dielectric layer in the nFET region.

2. The method of claim 1, wherein annealing the first high-k dielectric layer comprises causing atoms from the pFET work-function metal to diffuse through the first sacrificial layer into the portion of the first high-k dielectric layer in the pFET region.

3. The method of claim 1, wherein the second sacrificial layer prevents atoms from the nFET work-function metal from diffusing into the portion of the first high-k dielectric layer in the pFET region while annealing the first high-k dielectric layer.

4. The method of claim 1, wherein annealing the first high-k dielectric layer comprises causing atoms from the nFET work-function metal layer to diffuse into the portion of the first high-k dielectric layer in the nFET region and causing atoms from the pFET work-function metal to diffuse into the portion of the first high-k dielectric layer in the pFET region.

5. The method of claim 1, wherein annealing the first high-k dielectric layer comprises annealing the first high-k dielectric layer in the presence of a nitrogen source to cause atoms from the nitrogen source to diffuse into the portion of the first high-k dielectric layer in the nFET region.

6. The method of claim 5, wherein the nitrogen source comprises ammonia or nitrous oxide.

7. A method of forming a semiconductor device comprising:
   depositing a first high-k dielectric layer above a semiconductor substrate having a pFET region and an nFET region;
   depositing a first sacrificial layer above and in direct contact with a portion of the first high-k dielectric layer only in the pFET region, a pFET work-function metal layer above and in direct contact with the first sacrificial layer, and a second sacrificial layer above and in direct contact with the pFET work-function metal layer;
   depositing an nFET work-function metal layer above and in direct contact with another portion of the first high-k dielectric layer in the nFET region and above and in direct contact with the second sacrificial layer in the pFET region;
   causing atoms from the nFET work-function metal layer to diffuse into the portion of the first high-k dielectric layer in the nFET region and causing atoms from the pFET work-function metal to diffuse into the portion of the first high-k dielectric layer in the pFET region by annealing the pFET work-function metal layer, the nFET work-function metal layer, and the first high-k dielectric layer in the presence of a nitrogen source; and removing the first sacrificial layer; the pFET work-function metal layer, the second sacrificial layer, and the nFET work-function metal selective to the first high-k dielectric layer.

8. The method of claim 7, wherein the first high-k dielectric layer comprises a material selected from a group consisting of $SiO_2$, $HfO_2$, $ZrO_2$, $Al_2O_3$, $TiO_2$, $La_2O_3$, $SrTiO_3$, and $LaAlO_3$.

9. The method of claim 7, wherein the first sacrificial layer comprises titanium nitride or tantalum nitride.

10. The method of claim 7, wherein the first sacrificial layer has a thickness of approximately 0.2 nm to approximately 2.5 nm.

11. The method of claim 7, wherein the second sacrificial layer comprises titanium nitride or tantalum nitride.

12. The method of claim 7, wherein the second sacrificial layer has a thickness of approximately 0.2 nm to approximately 5 nm.

13. The method of claim 7, wherein the pFET work-function metal layer comprises aluminum or molybdenum.

14. The method of claim 7, wherein the nFET work-function metal layer comprises lanthanum oxide, magnesium oxide, strontium titanate, or strontium oxide.

15. The method of claim 7, wherein annealing the first high-k dielectric layer in the presence of the nitrogen source occurs at temperatures of approximately 500 degrees Celsius to approximately 750 degrees Celsius and pressures of approximately 0.1 torr to approximately 780 torr for approximately 5 seconds to 300 seconds.

16. The method of claim 7, wherein annealing the first high-k dielectric layer in the presence of the nitrogen source comprises heating the first high-k dielectric layer in the presence of ammonia or nitrous oxide.

17. A method of forming a semiconductor device comprising:

forming a first high-k dielectric layer above a semiconductor substrate having a pFET region and an nFET region;

depositing a pFET stack above and in direct contact with a portion of the first high-k dielectric layer only in the pFET region of the semiconductor substrate, wherein the pFET stack comprises a first sacrificial layer above and in direct contact with the first high-k dielectric layer, a pFET work-function metal layer above and in direct contact with the first sacrificial layer, and a second sacrificial layer above and in direct contact with the pFET work-function metal layer;

depositing a nFET work-function metal above and in direct contact with another portion of the first high-k dielectric layer in the nFET region of the semiconductor substrate and above and in direct contact with the pFET stack in the pFET region of the semiconductor substrate;

annealing the first high-k dielectric layer, the pFET work-function metal, and the nFET work-function metal in the presence of a nitrogen source causing atoms to diffuse from the nFET work-function metal and from the nitrogen source into the portion of the first high-k dielectric layer in the nFET region and causing atoms to diffuse from the pFET work-function metal into the portion of the first high-k dielectric layer in the pFET region;

removing the nFET work-function metal and the pFET stack selective to the first high-k dielectric layer;

forming a gate electrode layer above the first high-k dielectric layer;

forming an nFET gate stack by etching the gate electrode layer and the first high-k dielectric layer in the nFET region; and forming a pFET gate stack by etching the gate electrode layer and the first high-k dielectric layer in the pFET region.

18. The method of claim 17, wherein annealing the first high-k dielectric layer comprises causing atoms from the pFET work-function metal to diffuse through the first sacrificial layer into the first high-k dielectric layer in the pFET region.

19. The method of claim 17, wherein the second sacrificial layer prevents atoms from the nFET work-function metal from diffusing into the first high-k dielectric layer in the pFET region while annealing the first high-k dielectric layer.

20. The method of claim 17, further comprising forming a second high-k dielectric layer above the first high-k dielectric layer prior to forming the gate electrode layer.

* * * * *